United States Patent
Chiu et al.

(10) Patent No.: US 10,868,136 B2
(45) Date of Patent: *Dec. 15, 2020

(54) SIDEWALL PASSIVATION FOR HEMT DEVICES

(71) Applicant: Taiwan Semiconductor Manufacturing Co., Ltd., Hsin-Chu (TW)

(72) Inventors: Han-Chin Chiu, Kaohsiung (TW); Chi-Ming Chen, Zhubei (TW); Cheng-Yuan Tsai, Chu-Pei (TW); Fu-Wei Yao, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/695,392

(22) Filed: Nov. 26, 2019

(65) Prior Publication Data

US 2020/0098889 A1    Mar. 26, 2020

Related U.S. Application Data

(60) Continuation of application No. 16/010,641, filed on Jun. 18, 2018, now Pat. No. 10,522,647, which is a (Continued)

(51) Int. Cl.
*H01L 29/66*  (2006.01)
*H01L 29/778* (2006.01)
(Continued)

(52) U.S. Cl.
CPC .... *H01L 29/66462* (2013.01); *H01L 21/0217* (2013.01); *H01L 21/0228* (2013.01);
(Continued)

(58) Field of Classification Search
CPC ........... H01L 29/66462; H01L 29/0223; H01L 29/1066; H01L 21/02164; H01L 21/0217;
(Continued)

(56) References Cited

U.S. PATENT DOCUMENTS 6,849,882 B2    2/2005  Chavarkar et al.
7,649,215 B2    1/2010  Beach
(Continued)

FOREIGN PATENT DOCUMENTS

JP    2007073656 A    3/2007
JP    2008140813 A    6/2008

OTHER PUBLICATIONS

A. Asgari, et al.; "The Effects of GaN Capping Layer Thickness on Electrical Properties of Two-Dimensional Electron Gas in GaN/AlGaN/GaN Heterostructures"; School of Electrical, Electronic and Computer Engineering, The University of Western Australia; Sep. 3, 2013; p. 1-3.

(Continued)

*Primary Examiner* — Tong-Ho Kim
(74) *Attorney, Agent, or Firm* — Eschweiler & Potashnik, LLC

(57) ABSTRACT

Some embodiments of the present disclosure relate to a HEMT. The HEMT includes a heterojunction structure having a second III/V semiconductor layer arranged over a first III/V semiconductor layer. Source and drain regions are arranged over the substrate and spaced apart laterally from one another. A gate structure is arranged over the heterojunction structure and arranged between the source and drain regions. A first passivation layer is disposed about sidewalls of the gate structure and extending over an upper surface of the gate structure, wherein the first passivation layer is made of a III-V material. A second passivation layer overlies the first passivation layer and made of a material composition
(Continued)

different from a material composition of the first passivation layer. The second passivation layer has a thickness greater than that of the first passivation layer.

20 Claims, 6 Drawing Sheets

Related U.S. Application Data continuation of application No. 15/613,660, filed on Jun. 5, 2017, now Pat. No. 10,020,376, which is a continuation of application No. 15/234,590, filed on Aug. 11, 2016, now Pat. No. 9,685,525, which is a division of application No. 14/488,380, filed on Sep. 17, 2014, now Pat. No. 9,425,301.

(60) Provisional application No. 61/986,389, filed on Apr. 30, 2014.

(51) Int. Cl.
| | |
|---|---|
| *H01L 29/205* | (2006.01) |
| *H01L 21/02* | (2006.01) |
| *H01L 23/29* | (2006.01) |
| *H01L 29/20* | (2006.01) |
| *H01L 23/31* | (2006.01) |
| *H01L 29/78* | (2006.01) |
| *H01L 29/10* | (2006.01) |

(52) U.S. Cl.
CPC .... *H01L 21/0254* (2013.01); *H01L 21/02164* (2013.01); *H01L 21/02458* (2013.01); *H01L 23/291* (2013.01); *H01L 23/3171* (2013.01); *H01L 29/2003* (2013.01); *H01L 29/205* (2013.01); *H01L 29/7786* (2013.01); *H01L 29/7787* (2013.01); *H01L 29/7848* (2013.01); *H01L 29/1066* (2013.01); *H01L 2924/0002* (2013.01)

(58) Field of Classification Search
CPC ........... H01L 21/0228; H01L 21/02458; H01L 21/0254; H01L 23/3171; H01L 2924/0002; H01L 23/291
USPC ........................................ 438/172
See application file for complete search history.

(56) References Cited

U.S. PATENT DOCUMENTS

| | | | |
|---|---|---|---|
| 8,803,158 | B1 | 8/2014 | Chiu et al. |
| 10,522,647 | B2 * | 12/2019 | Chiu .................. H01L 21/0217 |
| 2003/0052374 | A1 | 3/2003 | Lee et al. |
| 2004/0007786 | A1 | 1/2004 | Kim |
| 2005/0258431 | A1 | 11/2005 | Smith et al. |
| 2006/0145190 | A1 | 7/2006 | Salzman et al. |
| 2007/0018210 | A1 | 1/2007 | Sheppard |
| 2008/0067546 | A1 | 3/2008 | Murata et al. |
| 2009/0121775 | A1 | 5/2009 | Ueda et al. |
| 2009/0212324 | A1 | 8/2009 | Tamai et al. |
| 2010/0109051 | A1 | 5/2010 | Wu et al. |
| 2010/0258841 | A1 | 10/2010 | Lidow et al. |
| 2012/0119219 | A1 | 5/2012 | Takado et al. |
| 2013/0341678 | A1 | 12/2013 | Green et al. |
| 2014/0106516 | A1 | 4/2014 | Curatola et al. |
| 2014/0175453 | A1 | 6/2014 | Yamada |
| 2014/0239307 | A1 | 8/2014 | Dargis et al. |
| 2014/0335666 | A1 | 11/2014 | Koehler et al. |

OTHER PUBLICATIONS

Ramakrishna Vetury, et al.; "The Impact of Surface States on the DC and RF Characteristics of AlGaN/GaN HFETs"; IEEE Transactions on Electron Devices, vol. 48, No. 3, Mar. 2001, p. 560-566.

X.Z. Dang, et al.; "Influence of Surface Processing and Passivation on Carrier Concentrations and Transport Properties in AlGaN/GaN Heterostructures"; Journal of Applied Physics; vol. 90, No. 3, Aug. 1, 2001, p. 1357-1361.

Bruce M. Green, et al.; "The Effect of Surface Passivation on the Microwave Characteristics of Undoped AlGaN/GaN HEMT's"; IEEE Electron Device Letters, vol. 21, No. 6, Jun. 2000, p. 268-270.

Injun Hwang, et al.; "p-GaN Gate HEMTs With Tungsten Gate Metal for High Threshold Voltage and Low Gate current"; IEEE Electron Device Letters, vol. 34, No. 2, Feb. 2013, p. 202-204.

O. Hilt, et al.; "Normally-off AlGaN/GaN HFET with p-type GaN Gate and AlGaN Buffer"; Proceedings of the 22nd International Symposium on Power Semiconductor Devices & ICs, Hiroshima; 2010; p. 1-4.

U.S. Appl. No. 14/016,302, filed Sep. 3, 2013.

Non Final Office Action dated Oct. 20, 2014 U.S. Appl. No. 14/016,302.

Final Office Action dated Mar. 4, 2015 U.S. Appl. No. 14/016,302.

Notice of Allowance dated Apr. 29, 2015 U.S. Appl. No. 14/016,302.

"Normally-off High-Voltage p-GaN Gate GaN HFET with Carbon-Doped Buffer," O. Hilt, et al., IEEE, pp. 239-242, May 2011.

"High-Voltage (600-V) Low-Leakage Low-Current-Collapse AlGaN/GaN HEMTs With AlN/SiNx Passivation," Zhikai Tang, et al., IEEE, vol. 34, No. 3, pp. 366-368, Mar. 2013.

Non-Final Office Action dated Sep. 15, 2015 for U.S. Appl. No. 14/488,380.

Final Office Action dated Jan. 21, 2016 for U.S. Appl. No. 14/488,380.

Notice of Allowance dated Apr. 22, 2016 for U.S. Appl. No. 14/488,380.

Non-Final Office Action dated Oct. 6, 2016 for U.S. Appl. No. 15/234,590.

Notice of Allowance dated Feb. 13, 2017 for U.S. Appl. No. 15/234,590.

Zhikai Tang et al., IEEE Electron Device Letters, vol. 34, No. 3, Mar. 2013, pp. 366-368.

Non-Final Office Action dated Oct. 20, 2017 for U.S. Appl. No. 15/613,660.

Notice of Allowance dated Mar. 13, 2018 for U.S. Appl. No. 15/613,660.

Non-Final Office Action dated Dec. 28, 2018 for U.S. Appl. No. 16/010,641.

Final Office Action dated Apr. 12, 2019 for U.S. Appl. No. 16/010,641.

Final Office Action dated Jul. 9, 2019 for U.S. Appl. No. 16/010,641.

Notice of Allowance dated Sep. 9, 2019 for U.S. Appl. No. 16/010,641.

* cited by examiner

SIDEWALL PASSIVATION FOR HEMT DEVICES

REFERENCE TO RELATED APPLICATIONS

This Application is a Continuation of U.S. application Ser. No. 16/010,641, filed on Jun. 18, 2018, which is a Continuation of U.S. application Ser. No. 15/613,660, filed on Jun. 5, 2017 (now U.S. Pat. No. 10,020,376, issued on Jul. 10, 2018), which is a Continuation of U.S. application Ser. No. 15/234,590, filed on Aug. 11, 2016 (now U.S. Pat. No. 9,685,525, issued on Jun. 20, 2017), which is a Divisional of U.S. application Ser. No. 14/488,380, filed on Sep. 17, 2014 (now U.S. Pat. No. 9,425,301, issued on Aug. 23, 2016), which claims the benefit of U.S. Provisional Application No. 61/986,389, filed on Apr. 30, 2014. The contents of the above-referenced Patent Applications are hereby incorporated by reference in their entirety.

BACKGROUND

High-electron-mobility transistors (HEMTs), also known as heterostructure FETs (HFETs) or modulation-doped FETs (MODFETs), are a type of field-effect transistor. Whereas a traditional n-type MOSFET includes a gate electrode arranged over a p-type doped channel region that separates n-type source/drain regions, for example, a HEMT device uses a heterojunction as the channel instead of a doped region. This heterojunction is defined by an interface at which two materials with different band gaps meet one another. III-N (tri nitride) devices are one type of HEMT where the heterojunction is made up of a Group-III material (e.g., Al, Ga, In) and a nitride (N) material. These III-N devices show very promising performance in high-power and high-frequency applications. III-N devices can be used, for example, in high power-high frequency applications such as emitters for cell phone base stations, Direct Broadcast Satellite (DBS) receivers, electronic warfare systems, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
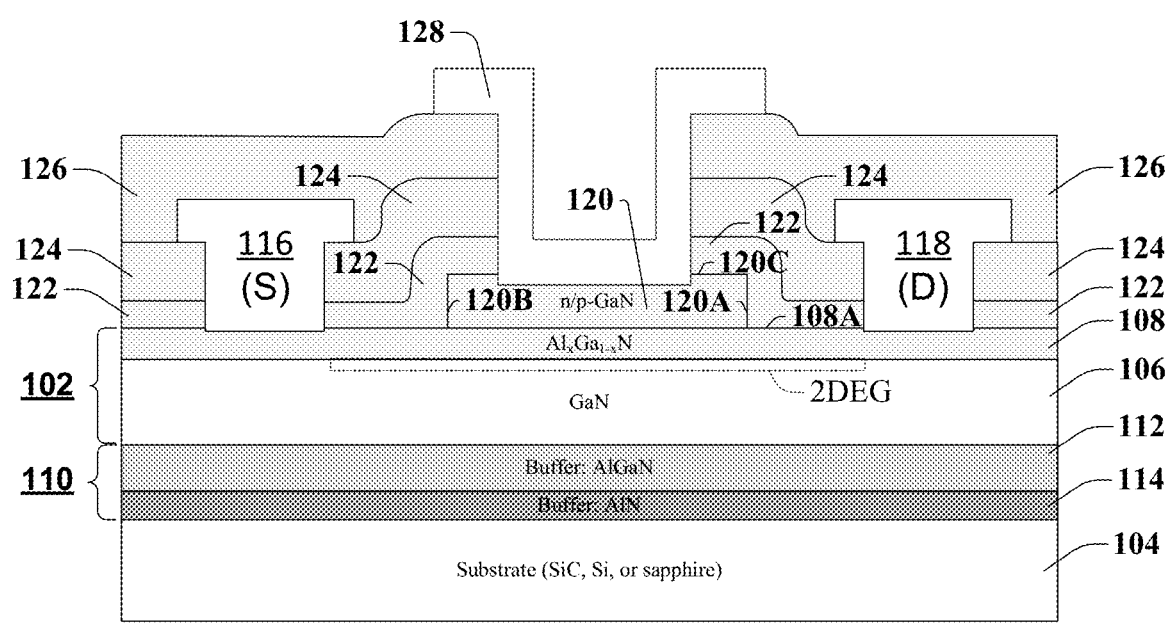
FIG. 1 shows some embodiments of a cross sectional view of a HEMT device in accordance with some embodiments of the present disclosure.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

HEMT devices use a heterojunction between two materials with different band gaps as a channel. For example, in some III-N HEMT devices, a wide bandgap AlGaN layer can form a heterojunction with a narrow bandgap GaN layer. The lattice constants of these two materials are typically slightly different. The difference in the lattice structures of these types of materials produces a strain that can result in pizeoelectricity-induced polarization and form band bending at the heterojunction interface. For example, a GaN HEMT typically has a strong surface polarization that causes it to operate with normally-on (depletion-mode) status. To overcome the surface polarization and control the flow of charge carriers in an enhancement mode device, a gate having a p-GaN material with a high work function can be formed directly on top of the AlGaN layer.

However, the GaN HEMT with an AlGaN/GaN as the schottky barrier and a p-GaN gate as the control gate results in a large gate leakage. Besides, in order to form an enhancement mode device structure, lots of III-N surfaces suffered process-induced traps or damage. These traps or damage mainly contribute gate leakage or device leakage current which causes device performance to degrade. To attempt to limit the number of traps (and thereby improve device performance), the present disclosure sets forth techniques where a passivation layer is formed on III-N surface, for example sidewalls of the p-GaN. This passivation layer terminates and passivates dangling bonds on the surface of gate sidewall surfaces to limit the number of interfacial traps and thereby helps to improve device performance. Thus, gate leakage can be reduced by introducing this passivation layer.

FIG. 1 shows some embodiments of a cross sectional view of a HEMT device 100 in accordance with the present disclosure. The HEMT device 100 includes a heterojunction structure 102 arranged over a semiconductor substrate 104. The heterojunction structure 102 is made up of a binary III/V semiconductor layer 106, and a ternary III/V semiconductor layer 108 arranged over the binary III/V semiconductor layer 106. The binary III/V semiconductor layer 106 is made of a first III-nitride material and acts as a channel region of the e-HEMT. The ternary III/V semiconductor layer 108 is made of a second III-nitride layer and acts as a barrier layer, somewhat analogous to a gate dielectric for a conventional MOSFET. In some embodiments, the binary III/V semiconductor layer 106 is made of gallium nitride (GaN), and the ternary III/V semiconductor layer 108 is made of Aluminum Galium Nitride ($Al_xGa_{1-x}N$, where 0<x<1).

One or more buffer layers 110 can be arranged between the heterojunction structure 102 and the substrate 104. These buffer layers 110 can help gradually distribute strain over their thickness, wherein the strain is due to lattice mismatch between the substrate 104 and the binary III/V layer 106. By distributing strain, these buffer layers 110 can help ward off trap formation in some regards. The illustrated buffer layers 110 include an uppermost buffer layer 112 abutting the binary III/V layer 106, as well as a lower buffer layer 114 between the upper buffer layer 112 and the substrate 104. In some embodiments, the uppermost buffer layer 112 can be made of AlGaN, and the lower buffer layer 114 can be made of AlN. In other embodiments, more than two buffer layers can be included between the heterojunction structure 102 and substrate 104.

Conductive source and drain regions 116, 118 are arranged over the ternary III/V semiconductor layer 108 and spaced apart laterally from one another. The conductive source and drain regions 116, 118 have respective lower regions which abut the ternary III/V semiconductor layer 108 and which are ohmically coupled to the ternary III/V semiconductor layer 108. In some embodiments, the source/drain regions 116, 118 rest directly on and abut the ternary III/V semiconductor layer 108 and are spaced apart from the binary III/V semiconductor layer 106. However, in other embodiments, the source/drain regions 116, 118 extend through the ternary III/V semiconductor layer 108 and abut the binary III/V semiconductor layer 106.

A gate structure 120 is arranged over the heterojunction structure 102 and is arranged laterally between the conductive source and drain regions 116, 118. The gate structure 120 is made of a third III-nitride material. For example, in some embodiments, the gate structure 120 can be made of GaN, which has been doped with donor impurities to form an n-type gate structure or which has been doped with acceptor impurities to form a p-type gate structure. These dopants help to make the resultant HEMT device 100 operate in enhancement mode as opposed to depletion mode.

A first conformal passivation layer 122 is disposed about gate structure sidewalls 120A, 120B and over an upper gate structure surface 120C. The first conformal passivation layer 122 is also disposed over an upper surface 108A of the ternary III/V barrier semiconductor layer 108. This first conformal passivation layer 122, which can be made of aluminum nitride (AlN) or boron nitride (BN) in some embodiments, can be a high quality thin film to prevent current leakage from the gate structure 120. Thus, in some embodiments, the first conformal passivation layer 122 is grown by atomic layer deposition (ALD) techniques, which although time-intensive, produce a very high quality film. The first conformal passivation layer 122 can have a thickness of between approximately 5 angstroms and approximately 500 angstroms in some embodiments. In addition to providing a high quality film, ALD techniques are advantageous because they can be carried out at relatively low temperature, for example between 200° C. and 500° C., which helps limit thermal budget issues, and because ALD techniques provide good step coverage compared to PVD.

A second conformal passivation layer 124 is disposed over the first conformal passivation layer 122. This second conformal passivation layer 124 can help protect the first conformal passivation layer 122 during processing. In some embodiments, this second conformal passivation layer 124 can be made of a nitride (e.g., SiN) or an oxide (e.g., SiO2). The second conformal passivation layer 124 can have a thickness that is greater than that of the first conformal passivation layer 122 and can be formed by a technique that is different from that used to form the first conformal passivation layer 122. For example, in some embodiments, the second conformal passivation layer 124 can have a thickness of approximately 50 nanometers to approximately 500 nanometers. Further, in some embodiments, the second conformal passivation layer 124 can be formed by chemical vapor deposition (CVD), plasma-enhanced chemical vapor deposition (PECVD), or plasma vapor deposition (PVD), for example.

The conductive source/drain regions 116, 118 extend downward through the first and second passivation layers 122, 124 to ohmically couple to the ternary III/V semiconductor layer 108. The conductive source/drain regions 116, 118 can be metal, such as copper, aluminum, tungsten, nickel, iron, cobalt, silver, gold, or platinum, for example.

A conformal dielectric capping layer 126 overlies the conductive source/drain regions 116, 118. In some embodiments, this conformal dielectric capping layer 126 is a nitride (e.g., SiN) or an oxide (e.g., SiO2), for example. In some embodiments, the conformal dielectric capping layer 126 has a thickness that is greater than or equal to the thickness of second conformal passivation layer 124.

A metal electrode liner or metal electrode contact 128 extends downward through the dielectric capping layer 126 and through the first and second passivation layers 122, 124 to form an ohmic connection to the gate structure 120. In some embodiments the metal electrode liner or metal electrode contact 128 is formed by PVD or CVD. The metal electrode liner or metal electrode contact 128 can extend downwardly along sidewalls of the capping layer 126 and of the first and second passivation layers 122, 124 before ohmically contacting an upper surface region of the gate structure 120.

Due to a difference in bandgaps between the binary III/V layer 106 and ternary III/V layer 108, highly mobile charge carriers in the form of a two-dimensional electron gas (2DEG) are established at the interface between layers 106, 108. Hence, during operation, a voltage applied to the gate electrode 120 controls the number of carriers (e.g., 2DEG) that can flow from the source 116 to the drain 118, or vice versa, through a channel region in layer 106. Thus, whether the HEMT 100 is in a conductive or resistive state can be controlled by controlling the 2DEG with the help of the gate electrode 120. In many cases the HEMT device 100 is an enhancement mode device, which operate similar to silicon MOSFET devices by normally being in a non-conducting state (normally off). Due to the nature of the heterojunction interface between 106/108, and the formation of the 2DEG at this heterojunction interface in HEMTs, such devices that are formed in the III-N materials system tend to be normally on, or depletion mode devices. i.e.; the high electron mobility of the 2DEG at the interface of the AlGaN/GaN layers permits the III-N device, such as a HEMT device, to conduct without the application of a gate potential.

In the off-state, traditional enhancement mode HEMT (e-HEMT) devices can exhibit current leakage from their gate structure. The passivation layer 122 can help limit this current leakage by approximately an order of magnitude in some instances.

Figure 2:
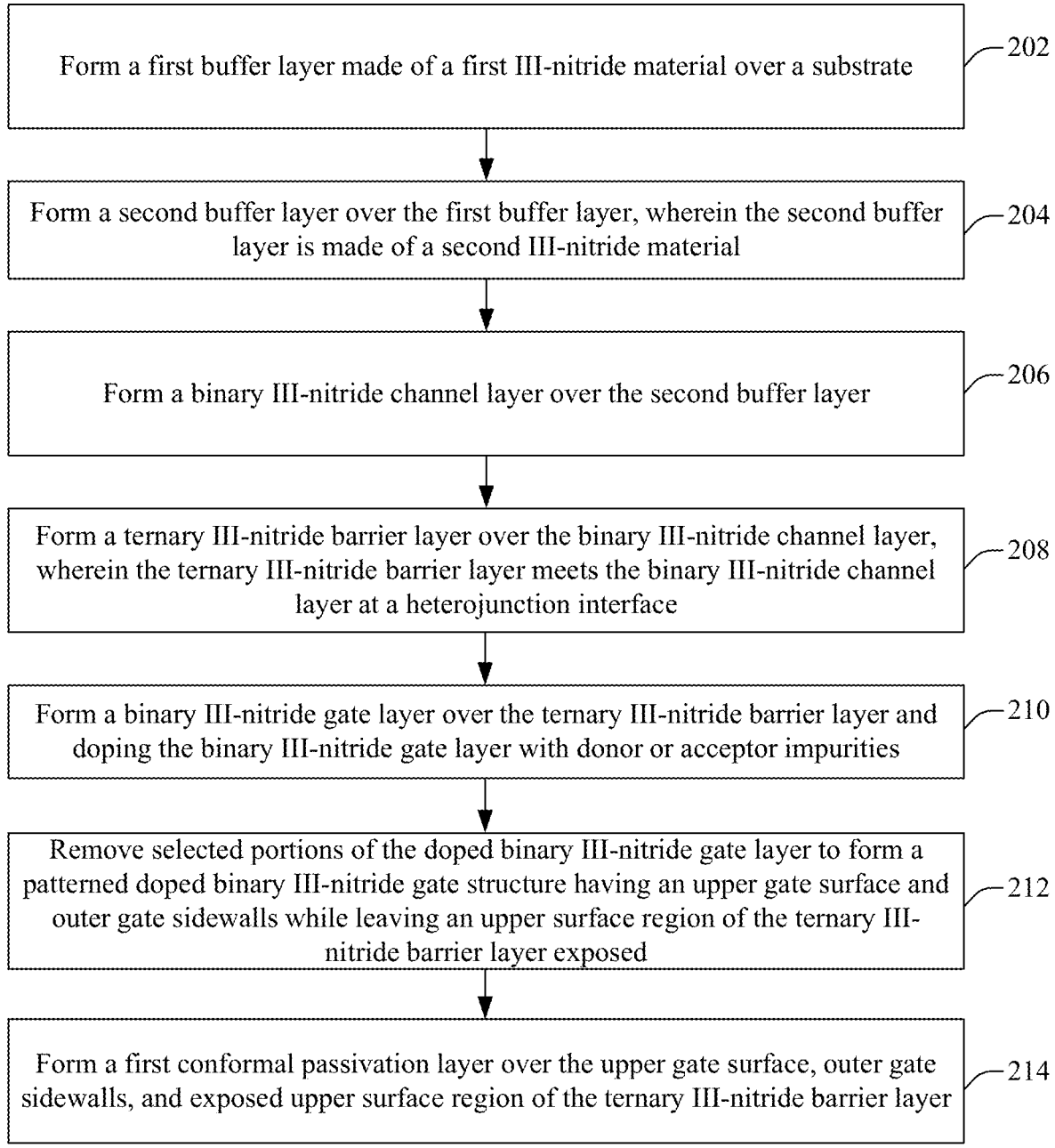
FIG. 2 shows a flow diagram of a method of manufacturing an e-HEMT device in accordance with some embodiments of the present disclosure.

FIG. 2 illustrates a flow diagram of some embodiments of a method of manufacturing a HEMT device according to some embodiments of the disclosure. While method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

In 202, a first buffer layer made of a first III-nitride material is formed over a substrate. In 204, a second buffer layer is formed over the first buffer layer, wherein the second buffer layer is made of a second III-nitride material that is different from the first II-nitride material. In 206, a binary III-nitride channel layer is formed over the second buffer layer. In 208, a ternary III-nitride barrier layer is formed over the binary III-nitride channel layer. The ternary III-nitride barrier layer meets the binary III-nitride channel layer at a heterojunction interface. At 210, a binary III-nitride gate layer is formed over the ternary III-nitride barrier layer and is doped with donor or acceptor impurities. At 212, selected portions of the doped binary III-nitride gate layer are removed to form a patterned doped binary III-nitride gate structure having an upper gate surface and outer gate sidewalls. Removal of these selected portions leaves an upper surface region of the ternary III-nitride barrier layer exposed. At 214, a first conformal passivation layer is formed over the upper gate surface, outer gate sidewalls, and exposed upper surface region of the ternary III-nitride barrier layer. This first conformal passivation layer can help to reduce gate sidewall traps, and therefore helps limit current leakage from the gate structure during operation of the device.

Turning now to FIGS. 3-11, one can see a series of cross-sectional views that collectively depict formation of a HEMT device in accordance with some embodiments. It will be appreciated that although specific structural features are disclosed in these cross-sectional views, that these specific structural features are not necessarily required in all implementations.

Figure 3:
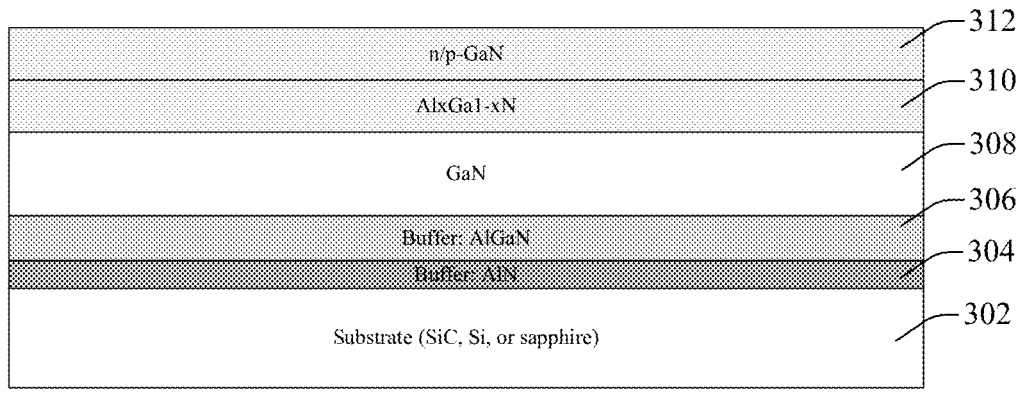
FIGS. 3-11 show a series of cross-sectional views that collectively depict a method of manufacturing a HEMT device in accordance with some embodiments of the present disclosure.

FIG. 3 is consistent with some embodiments of a structure formed by reference numerals 202-210 of FIG. 2. The structure of FIG. 3 includes a substrate 302, which can take a variety of different forms. In some embodiments, the substrate 302 is a silicon substrate, a silicon carbide (SiC) substrate, or a sapphire substrate. A first buffer layer 304, which may in some instances be referred to as a lower buffer layer, is then formed over the substrate 302, for example by epitaxial growth techniques. In some instances, the first buffer layer 304 is an aluminum nitride (AlN) layer. A second buffer layer 306, which in some instances may be referred to as an upper-most buffer layer, is then formed over the first buffer layer 304, for example by epitaxial growth techniques. In some instances, the second buffer layer 306 is an AlGaN layer. A binary III-nitride channel layer 308 is then formed over the second buffer layer 306, for example by epitaxial growth techniques. In some instances, the binary III-nitride channel layer 308 is a GaN layer. A ternary III-nitride barrier layer 310 is formed over the binary III-nitride channel layer 308, for example by epitaxial growth techniques. In some embodiments, the ternary III-nitride barrier layer 310 is an $Al_xGa_{1-x}N$ layer, wherein $0<x<1$. A binary III-nitride gate layer 312 is formed over the ternary III-nitride barrier layer 310, for example by epitaxial growth techniques and is doped with donor or acceptor impurities. In some embodiments, the binary III-nitride gate layer 312 is an n-type or p-type GaN layer.

Figure 4:
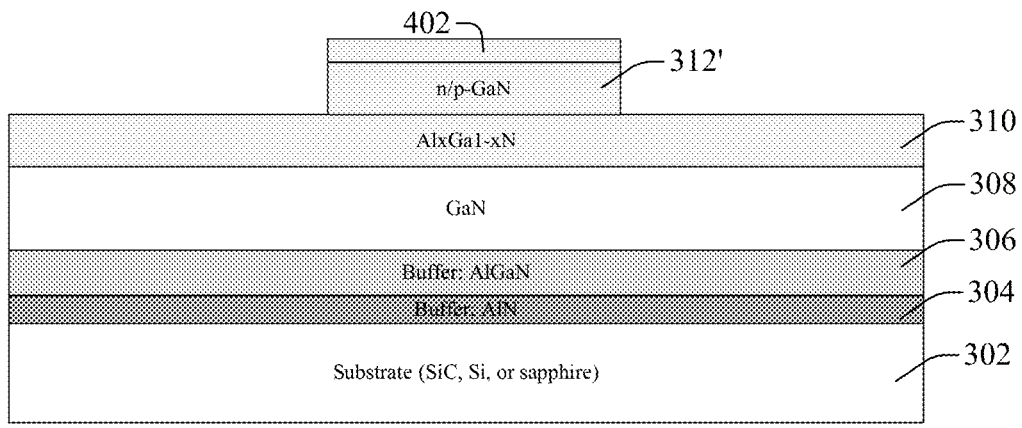

In FIG. 4, a gate structure mask layer is formed and patterned over the binary III-nitride gate layer. The gate structure mask layer can be a photoresist layer, a hardmask layer, such as a nitride layer, and/or other individual layers or combinations of layers. With the patterned gate structure mask 402 in place, an etch is performed to selectively remove exposed portions of the binary III-nitride gate layer 312, thereby leaving a gate structure 312' with a gate structure mask 402 thereover. The patterned gate structure mask 402 is then removed.

Figure 5:
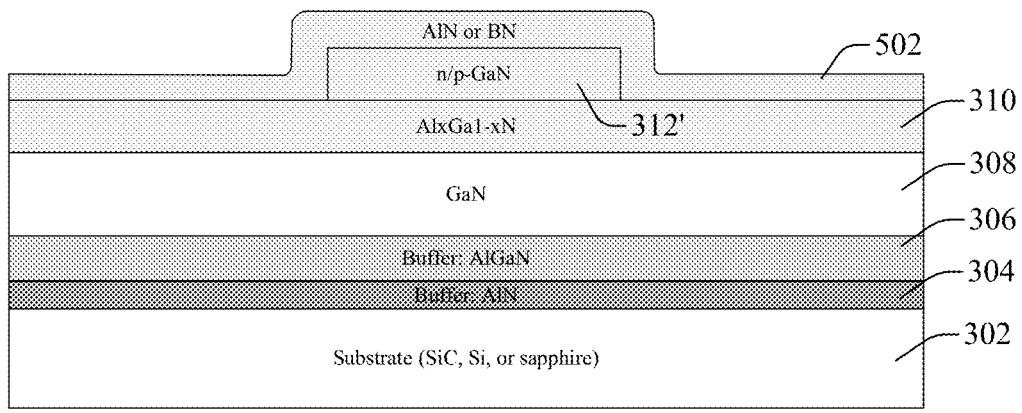

In FIG. 5, a first conformal passivation layer 502 is formed by atomic layer deposition (ALD). In some embodiments, the first conformal passivation layer 502 is AlN or BN, and is deposited to a thickness of between approximately 5 angstroms and 500 angstroms. To limit gate sidewall traps, the first conformal passivation layer 502 directly abuts sidewalls and upper surface of gate electrode 312'.

Figure 6:
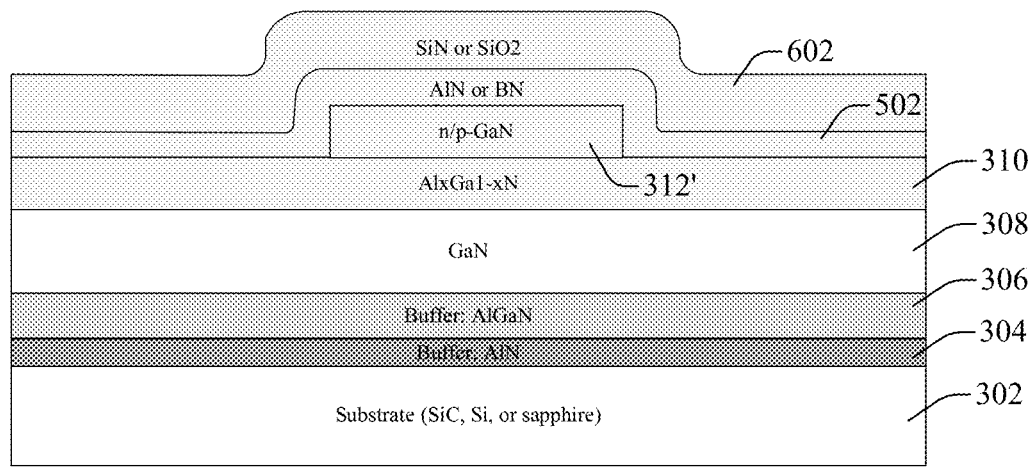

In FIG. 6, a second conformal passivation layer 602 is formed over the first conformal passivation layer 502 to protect the first conformal passivation layer 502 during processing. In some embodiments, the second conformal passivation layer is a nitride, such as SiN for example, or an oxide, such as SiO2 for example. In some embodiments, the second conformal passivation layer 602 is formed by a different technique than the first conformal passivation layer 502. For example, the second conformal passivation layer 602 can be formed by CVD, PECVD, or PVD, which has a deposition rate that is faster than that of ALD to maintain process throughput at good levels. To help protect the first conformal passivation layer 502, the thickness of the second passivation layer 602 can range between approximately 50 nm and approximately 500 nm.

Figure 7:
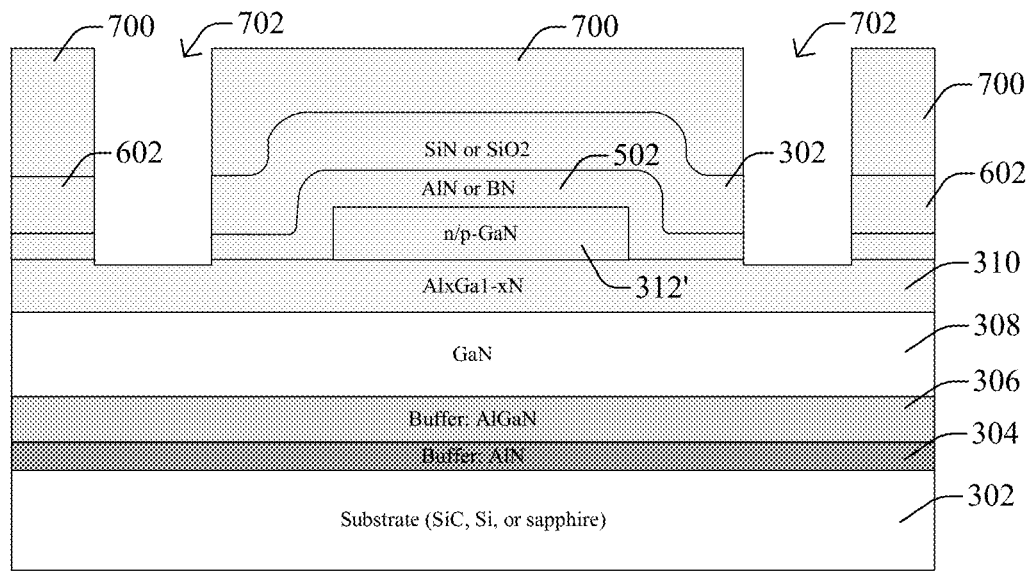
Figure 8:
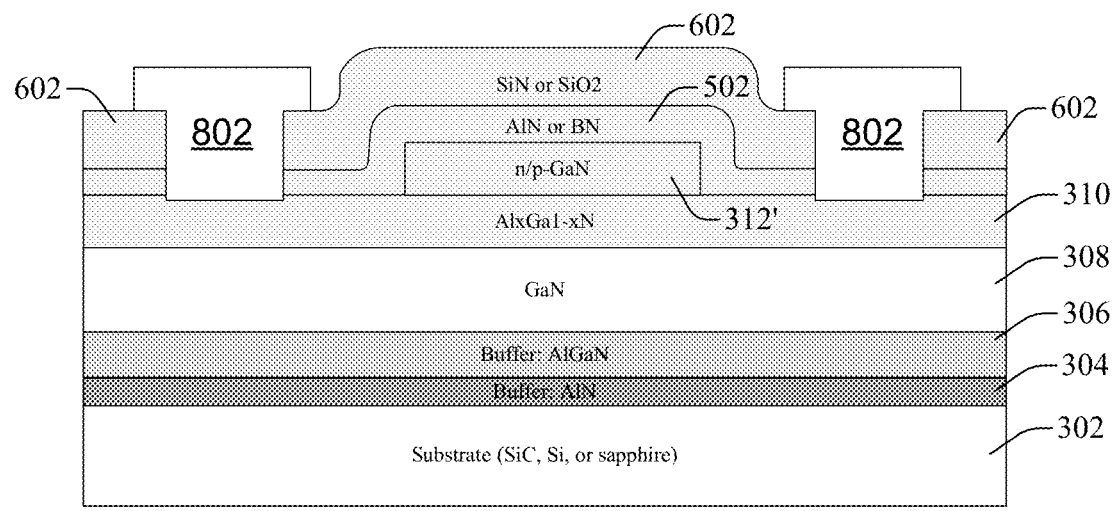

In FIG. 7, a source/drain mask 700 has been formed over the second conformal passivation layer. With the source/drain mask 700 in place, an etch, such as a dry etch for example, is performed to form source/drain openings 702 which extend through the first and second conformal passivation layers 502, 602 and which terminate on the ternary III-nitride barrier layer 310. Some portions of the ternary III-nitride barrier layer 310 can be removed/consumed during this etch, but other portions can be left under the source/drain openings 702 above the binary III-nitride channel layer 310. In FIG. 8, the source/drain mask 700 is removed, and the source/drain openings are filled with a conductive material, such as a metal. The metal when initially formed extends over the entire exposed surface of the second conformal passivation layer. Subsequently, a mask (not shown), such as a photoresist mask, is formed over the source/drain regions, and an etch, such as a dry etch, is carried out to form the illustrated conductive source/drain regions 802.

Figure 9:
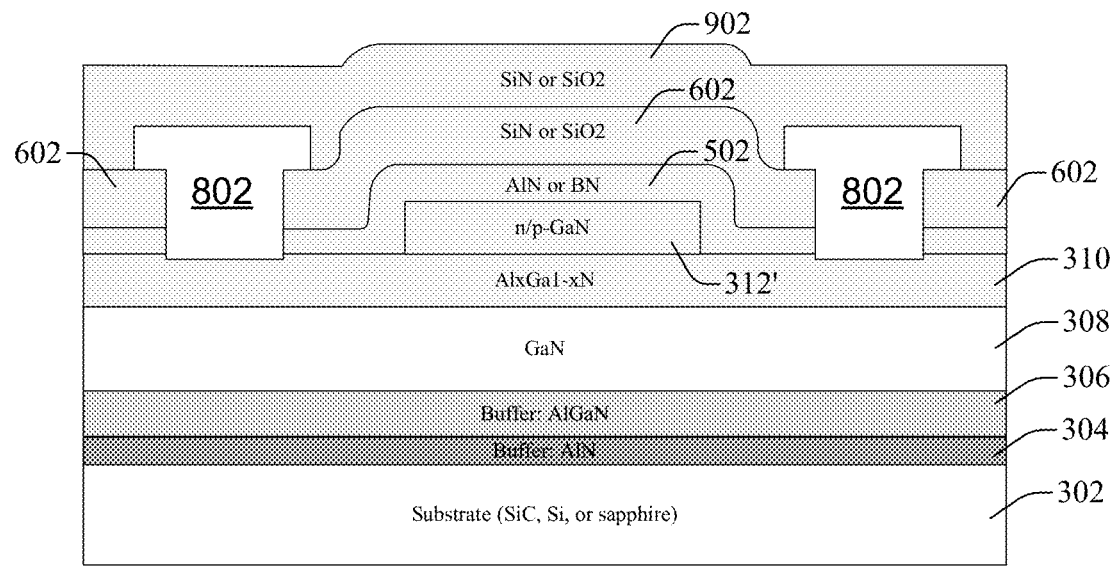

In FIG. 9, a conformal dielectric capping layer 902 is formed. In some embodiments, the conformal dielectric capping layer is a nitride, such as SiN for example, or an oxide, such as SiO2 for example.

Figure 10:
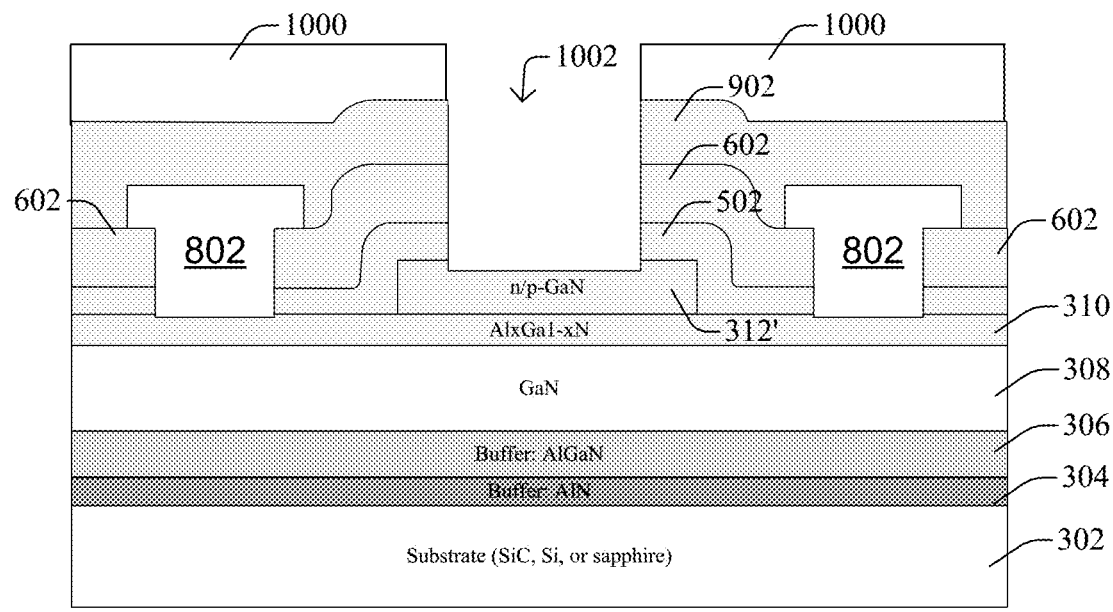

In FIG. 10, a gate electrode mask 1000 is formed over the dielectric capping layer. With the gate electrode mask in place, an etch, such as a dry etch, is performed to form a gate electrode opening 1002. The gate electrode opening extends through the dielectric capping layer, the first conformal passivation layer, and a second conformal passivation layer. The gate electrode opening terminates on the patterned doped binary III-nitride gate structure.

Figure 11:
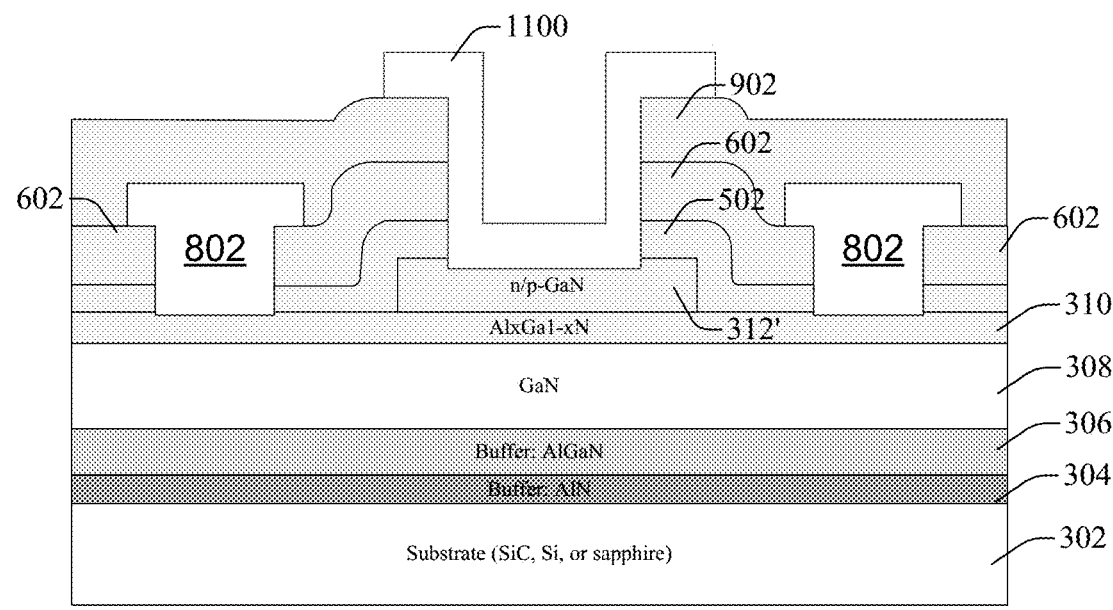

In FIG. 11, a conductive gate electrode liner 1100 is formed in the gate electrode opening. In some embodiments, the conductive gate electrode liner is deposited by PVD or CVD. The conductive gate electrode layer can comprise a metal, such as aluminum, copper, tungsten, or nickel, for example, or can include other conductive materials, such as doped polysilicon for example.

As can be appreciated from the foregoing, the present disclosure sets forth techniques whereby a passivation layer is formed over sidewalls of the gate electrode to limit interfacial traps. This passivation layer terminates and passivates dangling bonds on the surface of gate sidewall surfaces to limit the number of interfacial traps and helps to improve device performance. In particular, this passivation layer reduces gate leakage current.

Therefore, some embodiments of the present disclosure relate to a high electron mobility transistor (HEMT) which includes a heterojunction structure arranged over a semiconductor substrate. The heterojunction structure includes a second III/V semiconductor layer arranged over a first III/V semiconductor layer. Source and drain regions are arranged over the substrate and spaced apart laterally from one another. A gate structure is arranged over the heterojunction structure and arranged between the source and drain regions. A first passivation layer is disposed about sidewalls of the gate structure and extending over an upper surface of the gate structure, wherein the first passivation layer is made of a III-V material. A second passivation layer overlies the first passivation layer and made of a material composition different from a material composition of the first passivation layer. The second passivation layer has a thickness greater than that of the first passivation layer.

Other embodiments of the present disclosure relate to a high electron mobility transistor (HEMT) formed on a substrate. The HEMT includes an AlN buffer layer over the substrate. An AlGaN buffer layer is arranged over the AlN buffer layer. A GaN channel layer is arranged over the AlGaN buffer layer. An AlGaN barrier layer is arranged over the GaN channel layer. A GaN gate structure is in direct contact with the upper planar surface of the AlGaN barrier layer. An AlN or BN passivation layer is in direct contact with the upper planar surface of the AlGaN barrier layer and extending over an upper surface of the GaN gate structure and abutting an outer sidewall of the GaN gate structure. A SiO2 passivation layer is disposed along outer sidewalls of the AlN or BN passivation layer and over an upper surface of the AlN or BN passivation layer.

Still other embodiments relate to a high electron mobility transistor (HEMT) which includes a heterojunction structure arranged over a substrate. The heterojunction structure comprising: a channel layer comprising a first III-nitride material, and a barrier layer comprising a second III-nitride material. Source and drain regions are in direct contact with an upper surface of the heterojunction structure and spaced apart laterally from one another. A gate structure is arranged between the source and drain regions and directly on the upper surface of the heterojunction structure and made of a third III-nitride material. A first passivation layer is disposed directly on the upper surface of the heterojunction structure, about sidewalls and an upper surface of the gate structure, and comprising a fourth III-nitride material. A second passivation layer is disposed directly on the first passivation layer covering a top surface of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high electron mobility transistor (HEMT), comprising:
   a heterojunction structure arranged over a substrate, the heterojunction structure comprising: a first III/V semiconductor layer, and a second III/V semiconductor layer arranged over the first III/V semiconductor layer and made of a material composition different from a material composition of the first III/V semiconductor layer;
   source and drain regions arranged over the substrate and spaced apart laterally from one another;
   a gate structure arranged over the heterojunction structure and arranged between the source and drain regions;
   a first passivation layer disposed about sidewalls of the gate structure and extending over an upper surface of the gate structure, wherein the first passivation layer is made of a III-V material; and
   a second passivation layer overlying the first passivation layer and made of a material composition different from a material composition of the first passivation layer;
   wherein the second passivation layer has a thickness greater than that of the first passivation layer.

2. The HEMT of claim 1, wherein the first passivation layer has a thickness of between approximately 5 angstroms and approximately 500 angstroms.

3. The HEMT of claim 1, wherein the second passivation layer has a thickness of approximately 50 nanometers to approximately 500 nanometers.

4. The HEMT of claim 1, wherein the III-V material of the first passivation layer is different from the first III/V semiconductor layer and the second III/V semiconductor layer.

5. The HEMT of claim 1, further comprising:
   one or more buffer layers under the first III/V semiconductor layer, wherein an uppermost buffer layer is made of the same material of the second III/V semiconductor layer of the heterojunction structure, and wherein a lower buffer layer under the uppermost buffer layer is made of the same material of the first III/V semiconductor layer of the heterojunction structure.

6. The HEMT of claim 5, wherein the first passivation layer is made of the same material as the lower buffer layer.

7. The HEMT of claim 6, wherein:
   the first III/V semiconductor layer is made of GaN;
   the second III/V semiconductor layer is made of $Al_xGa_{1-x}N$;
   the gate structure is made of n-type or p-type GaN; and
   the first passivation layer is made of AlN or BN.

8. The HEMT of claim 1,
   wherein the second passivation layer is conformally disposed along outer sidewalls of the first passivation layer and over an upper surface of the first passivation layer; and
   wherein a capping layer is conformally disposed along outer sidewalls of the second passivation layer and over an upper surface region of the second passivation layer.

9. The HEMT of claim 8, further comprising:
   a metal gate electrode including edges that overlie an upper surface region of the capping layer, and including inner sidewalls that extend downward along sidewalls of an opening through the capping layer, through the second passivation layer, and through the first passivation layer to be in direct electrical connection with an upper surface of the gate structure.

10. An enhancement mode high electron mobility transistor (HEMT), comprising:
   an AlN buffer layer over a substrate;
   an AlGaN buffer layer over the AlN buffer layer;
   a GaN channel layer over the AlGaN buffer layer;
   an AlGaN barrier layer over the GaN channel layer, wherein source and drain regions are over an upper planar surface of the AlGaN barrier layer;
   a GaN gate structure in direct contact with the upper planar surface of the AlGaN barrier layer; and
   an AlN or BN passivation layer in direct contact with the upper planar surface of the AlGaN barrier layer and extending over an upper surface of the GaN gate structure and abutting an outer sidewall of the GaN gate structure; and
   a $SiO_2$ passivation layer disposed along outer sidewalls of the AlN or BN passivation layer and over an upper surface of the AlN or BN passivation layer.

11. The HEMT of claim 10, further comprising:
   a SiN capping layer overlying the AlN or BN passivation layer, wherein the SiN capping layer has a lower surface abutting a lower sidewall of the SiO2 passivation layer.

12. The HEMT of claim 10,
   wherein the AlN or BN passivation layer has a thickness of between 5 Angstroms and 500 Angstroms; and
   wherein the a $SiO_2$ passivation layer has a thickness of 50 nm to 500 nm.

13. The HEMT of claim 10, wherein the source and drain regions extend through the AlN or BN passivation layer and through the $SiO_2$ passivation layer and terminate on the AlGaN barrier layer.

14. A high electron mobility transistor (HEMT), comprising:
   a heterojunction structure arranged over a substrate, the heterojunction structure comprising: a channel layer comprising a first III-nitride material, and a barrier layer comprising a second III-nitride material;
   source and drain regions in direct contact with an upper surface of the heterojunction structure and spaced apart laterally from one another;
   a gate structure arranged between the source and drain regions and directly on the upper surface of the heterojunction structure and made of a third III-nitride material; and
   a first passivation layer disposed directly on the upper surface of the heterojunction structure, about sidewalls and an upper surface of the gate structure, and comprising a fourth III-nitride material; and
   a second passivation layer disposed directly on the first passivation layer covering a top surface of the gate structure.

15. The HEMT of claim 14, further comprising:
   a capping layer conformally disposed over and covering a top surface of the second passivation layer.

16. The HEMT of claim 14, wherein the fourth III-nitride material of the first passivation layer is a binary III/V semiconductor material having different binary semiconductor constituents from the first and second III-nitride materials.

17. The HEMT of claim 14, further comprising:
   one or more buffer layers under the channel layer, wherein an uppermost buffer layer is made of the second III-nitride material and wherein a lower buffer layer under the uppermost buffer layer is made of the first III-nitride material.

18. The HEMT of claim 17, wherein the first passivation layer and the lower buffer layer are composed of same constituent materials.

19. The HEMT of claim 14, further comprising:
   wherein the source and drain regions extend through the first and second passivation layers and terminate on the barrier layer.

20. The HEMT of claim 14, wherein the first passivation layer has a first thickness and the second passivation layer has a second thickness that is greater than the first thickness.

* * * * *